United States Patent [19]

Kasuga et al.

[11] 4,321,685
[45] Mar. 23, 1982

[54] CIRCUIT FOR REDUCING THE LIMIT CYCLE IN A DIGITAL FILTER

[76] Inventors: Masao Kasuga, No. 1-6-17, Komachi-Douri Sagamihara-City, Kanagawa-Ken; Masaki Satoh, No. 5369, Izumi-Cho, Totsuka-Ku Yokohama-City, Kanagawa-Ken; Takashi Matsushige, No. 1-40, Fujimigaoka Minomiya-Machi, Naka-Gun, Kanagawa-Ken, all of Japan

[21] Appl. No.: 95,554

[22] Filed: Nov. 19, 1979

[30] Foreign Application Priority Data

Nov. 20, 1978 [JP] Japan ................................ 53-143179
Nov. 24, 1978 [JP] Japan ................................ 53-144120
Dec. 25, 1978 [JP] Japan ................................ 53-158662

[51] Int. Cl.³ .......................................... G06F 15/31
[52] U.S. Cl. ..................................... 364/724; 364/745
[58] Field of Search .............................. 364/724, 745

[56] References Cited

U.S. PATENT DOCUMENTS

| | | | |
|---|---|---|---|
| 3,749,895 | 7/1973 | Kao ................................. | 364/724 X |
| 3,906,199 | 9/1975 | Kieburtz et al. ................ | 364/724 X |
| 4,034,196 | 7/1977 | Butterweck et al. ............ | 364/745 |
| 4,213,187 | 7/1980 | Lawrence ........................ | 364/724 |

OTHER PUBLICATIONS

Parker et al., "Limit-Cycle Oscillations in Digital Filters", *IEEE Trans. on Circuit Theory*, vol. CT-18, No. 6, Nov. 1971, pp. 687-697.

Tran-Thong, "Limit Cycles in the Combinatorial Implementation of Digital Filters", *IEEE Trans. on Acoustics, Speech and Signal Processing*, vol. ASSP-24, No. 3, Jun. 1976, pp. 248-256.

*Primary Examiner*—David H. Malzahn

[57] ABSTRACT

A circuit arrangement of a digital filter comprises an A/D converter supplied with an input analog signal and producing as output a pulse-modulated digital signal, a digital filter for subjecting the digital signal from the A/D converter to a digital operation processing of finite word length, a D/A converter supplied with the resulting output digital signal of the digital filter and converting the same into an analog signal thereby to generate an output analog signal, an input detector for detecting the state wherein there is substantially no input analog signal and responsively producing as output a detection signal, an integrator for integrating the output of the D/A converter, a switching circuit for operating in response to the output detection signal of the input detector to pass the resulting output signal of the integrator, a reference voltage source, and an adder for adding the signal thus passed by the switching circuit and a reference voltage from the reference voltage source and feeding back and imparting the sum signal thus obtained to the A/D converter.

8 Claims, 13 Drawing Figures

CIRCUIT FOR REDUCING THE LIMIT CYCLE IN A DIGITAL FILTER

BACKGROUND OF THE INVENTION

The present invention relates generally to digital filter circuit arrangements and more particularly to a digital filter circuit arrangement capable of reducing a limit cycle generated when an input signal is not introduced into a digital filter.

A digital filter in which an analog signal is sampled, for example, with a specific sampling period T thereby to produce a sampled series signal, which is quantized, and a pulse code modulated (PCM) or difference modulated digital signal obtained by subjecting pulses to discontinuous level modulation is subjected to digital operation processing by a digital multiplier, a unit delay circuit which delays by a time equal to the above mentioned sampling period T, and an adder thereby to produce a digital signal as output has heretofore been known. An analog signal obtained by digital to analog (A/D) converting this output digital signal of the digital filter by means of a D/A converter becomes a signal which is the result of imparting a specific frequency characteristic to the original source analog signal of the input digital signal of the digital filter.

With a recursive digital filter which undergoes an operation as represented by the following difference equation as an example of such a digital filter, the generation of a limit cycle will be described.

$$y_n = a_0 x_n - b_1 y_{n-1} \quad \ldots (1)$$

In Eq. (1): $y_n$ is the value of the output signal of the digital filter at the time instant $nT$ (where $n$ is an integer, and $T$ is the above mentioned sampling period); $x_n$ is the value of the input signal of the digital filter at the time instant $nT$; and $a_0$ and $b_1$ are respectively coefficients expressed by finite numbers of bits.

For the sake of simplicity of description, the above coefficients $a_0$ and $b_1$ and the output $y_{n-1}$ will be considered to be continuous values (analog quantities), and the values of $a_0 = 1.0$, $b_1 = 0.5$, and $y_{n-1} = 1.0$ will be taken. When there is no input digital signal of this digital filter, $x_n = 0$. Therefore, if this is substituted in Eq. (1), and calculation is carried out, the following values are obtained.

$$\left. \begin{array}{l} y_n = (1.0) \cdot (0.0) - (0.5) \cdot (1.0) = -0.5 \\ y_{n+1} = (1.0) \cdot (0.0) - (0.5) \cdot (-0.5) = 0.25 \\ y_{n+2} = (1.0) \cdot (0.0) - (0.5) \cdot (0.25) = -0.125 \\ y_{n+3} = (1.0) \cdot (0.0) - (0.5) \cdot (-0.125) = 0.0625 \\ y_{n+4} = (1.0) \cdot (0.0) - (0.5) \cdot (0.0625) = -0.03125 \end{array} \right\} \quad (2)$$

When the values of the output signals of the digital filter are represented by continuous values in this manner, they can be represented substantially limitlessly by numerals below the decimal point.

However, the digital filter is a nonlinear system for digital operation of finite word length, and, moreover, "rounding off" is carried out in accompaniment with the operation. Here, the term "rounding off" means the addition of one (unity) to the succeeding lower bit of the required number of bits and corresponds to counting fractions of 0.5 and over as a whole number and disregarding the rest. For this reason, in the case where, for example, an infinite bit representation is processed by rounding off to 4 bits, the value of $y_{n+5}, y_{n+6}, \ldots$ in Eq. (2) becomes 0.0625 by rounding off, and the output of the digital filter in this case becomes as indicated in the following table when there is no input digital signal as mentioned above.

| Output analog conversion value | Infinite bit representation | 4-bit representation by rounding off | Analog conversion value of actual output considering rounding off |
|---|---|---|---|
| $y_n = -0.5$ | 110000... | 1100 | $-0.5$ |
| $y_{n+1} = 0.25$ | 001000... | 0010 | 0.25 |
| $y_{n+2} = -0.125$ | 111100... | 1111 | $-0.125$ |
| $y_{n+3} = 0.0625$ | 000010... | 0001 | 0.125 |
| $y_{n+4} = -0.0625$ | 111110... | 1111 | $-0.125$ |
| $y_{n+5} = 0.0625$ | 000010... | 0001 | 0.125 |

Note:
In the above table, the bit representation is a complement representation of 2.

As is apparent from the above table, the digital output is repeated alternately as 0.125 and $-0.125$ as analog conversion values. This is the phenomenon called limit cycle.

When this limit cycle exists, a noise having a specific frequency spectrum is produced in the transmitted signal.

Accordingly, a method wherein masking is effected by impressing a random noise of white-noise character in order to render inconspicuous this noise having the specific frequency spectrum has heretofore been resorted to. This known method, however, has been accompanied by a problem in that it only makes the noise of the specific frequency spectrum inconspicuous, and noise is distributed over the entire frequency band.

In order to reduce a noise of a specific frequency spectrum of this nature, it is necessary to reduce the generation of a limit cycle.

SUMMARY OF THE INVENTION

Accordingly, it is a general object of the present invention to provide a novel and useful circuit arrangement of a digital filter in which the above described problem has been overcome.

Another and specific object of the invention is to provide a circuit arrangement of a digital filter in which a characteristic limit cycle which is generated therein when an input analog signal of an A/D conversion circuit does not exist is prevented or reduced. By the use of the circuit arrangement of the invention, the noise caused by the limit cycle can be eliminated or greatly reduced. Moreover, the digital filter can be quickly placed in a stable state.

Still another object of the invention is to provide a digital filter circuit arrangement in which an input detector produces as output an input-zero detection signal only when the above mentioned input analog signal does not exist continuously over a certain specific period. By the use of the circuit arrangement of the invention, the standard reference voltage of the A/D conversion circuit can be varied, not during a musical composition, but after completion of the composition, and an effective limit cycle reducing operation can be carried out.

A further object of the invention is to provide a circuit arrangement of a recursive digital filter capable of preventing oscillatory operation even when overflow arises.

An addition object of the invention is to provide a digital filter circuit arrangement in which an intermediate register is connected between the output end of an output register and the input end of an adder, and oscillation due to limitless feedback of the output digital signal of the adder can be prevented.

Other objects and further features of the invention will be apparent from the following detailed description with respect to preferred embodiments of the invention when read in conjunction with the accompanying drawings.

DETAILED DESCRIPTION OF THE INVENTION

The circuit arrangement of a digital filter according to the present invention will now be described with respect to one embodiment thereof in conjunction with FIG. 1. An analog signal introduced through an input terminal 11 is fed to an analog-to-digital (A/D) converter 12, where it is converted into a digital signal of a binary code due to discontinuous level modulation and rendered into a modulated digital signal (hereinafter referred to simply as a digital signal). This digital signal is supplied to a digital filter 13, where it is subjected to a digital operation of finite word length.

The resulting output signal of the digital filter 13 is supplied to a digital-to-analog (D/A) converter 14, where it is converted into an analog signal. The resulting output analog signal of the D/A converter 14, which is led out through an output terminal 15, is a signal which has been produced by the imparting of a specific frequency characteristic by the digital filter to the original analog signal introduced through the input terminal 11.

An important feature of the present invention is that a limit cycle reduction circuit 16 as described below is provided in the aforedescribed digital filter circuit arrangement known heretofore.

The analog signal introduced through the input terminal 11 is supplied also to an input detector 19 provided within the circuit 16 for limit cycle reduction. In the input detector 19, the presence or absence of an input analog signal is detected. The input detector 19 operates to detect the input-zero or the non-arrival continuously over a specific time period (5 msec. corresponding to 250 samples) of the input analog signal and to produce as output a switching signal. Accordingly, in the case where the input analog signal is, for example, a musical signal from a program source, the input detector 19 does not detect any momentary disappearance of the input signal during the rendition of the musical composition but detects the non-arrival of the musical signal upon completion of the composition.

On the other hand, the output analog signal of the D/A converter 14 is supplied also to an integrator 17, where it is integrated. The resulting output of the integrator 17 is supplied to a switching circuit 18. The switching circuit 18 is supplied with a switching signal produced as output by the input detector 19 when it detects the non-arrival of the input during the specific period and, in response to this switching signal, permits the output signal of the integrator 17 to pass to an adder 20. This output signal is added in the adder 20 to a reference voltage from a reference voltage source 21. The resulting output of the adder 20 is fed to the A/D converter 12 to vary the zero-level reference voltage thereof.

As a result, in spite of the absence of an input analog signal, the A/D converter 12 produces in accordance with the above mentioned varied reference voltage as an output of the same value as that at the time when an analog signal of a level which is relatively higher (or lower) by a difference equal to the difference between the reference voltages prior to and after the variation. As a consequence, this is equal, as a resultant effect, to the feedback with a specific ratio k of one portion of the output analog signal of the D/A converter 14 led out through the output terminal 15.

Therefore, when the input detector 19 detects the fact that, at the time instant $(n+6)T$, an analog signal is not being received as input through the input terminal 11, the value $y_{n+1}$ of the analog signal produced as output through the output terminal 15 at the time $(n+5)T$ is equal to 0.125, considering rounding off, as indicated in the table set forth hereinabove. For this reason, a digital signal equal to that when an analog signal $X_{n+6'}$ is introduced as input is led out from the A/D converter 12. Actually, the signal $X_{(n+6)}$ at the time $(n+6)T$ is zero, but, as mentioned above, when an output signal equal to that when there is an input signal is obtained, this assumed input signal is designated with a prime mark as in $X_{n+6'}$.

$$X_{n+6'} = k \cdot y_{n+5} = 1 \times 0.125 = 0.125 \quad (3)$$
$$\text{wherein } k = 1.$$

Therefore, the output signal of the output terminal 15 at this time, with consideration of rounding off, becomes as follows from Eq. (1), Eq. (3), etc.

$$\begin{aligned} y_{n+6} &= (1.0) \cdot X_{n+6'} - (0.5) \cdot y_{n+5} \\ &= 0.125 - (0.5) \times (0.125) \approx 0.125 - 0.125 \\ &= 0 \end{aligned} \quad (4)$$

In this Eq. (4), $(0.5) \times (0.125)$ does not become 0.0625 but becomes 0.125 because of rounding off. As a result, $X_{n+7'}$ and $y_{n+6}$ are both zero, whereby $y_{n+7}$ also becomes zero, and similarly thereafter the output signal of the output terminal 15 converges to zero. Accordingly, the limit cycle of the digital filter 13 is quickly reduced and removed.

Figure 2:
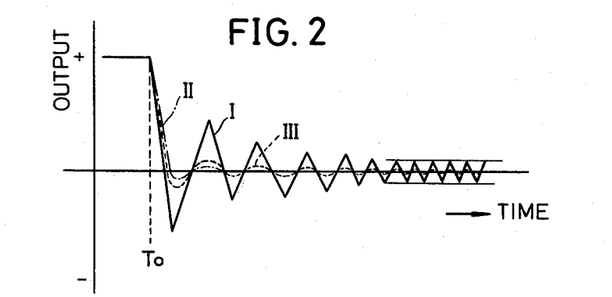
FIG. 2 is a graph comparatively indicating the output states of the digital filter when there is no input analog signal in the case where the circuit arrangement of the invention is used and in the case where it is not used.

In FIG. 2, the waveform designated by full line I is the output waveform of the digital filter, and the waveform portion Ia represents the limit cycle portion wherein 0.125 and −0.125 as analog conversion values are alternately repeated. After the time instant $T_0$, the input signal is zero. The one-dot chain line II indicates the waveform of the state wherein reduction of limit cycle has been carried out with the output caused to converge to zero by the above mentioned circuit 16 for limit cycle reduction. The broken line III indicates the waveform of the state wherein the reduction of limit cycle has been carried out by the above mentioned circuit 16 under other conditions. Thus, by the use of the circuit arrangement of the present invention, the generation of the limit cycle at the time when there is no incoming signal is greatly reduced, and, for this reason, there is almost no generation of noise.

While k is made equal to one (unity) in Eq. (3) given hereinabove, the value of k is actually so adjusted that the limit cycle will quickly converge to zero by appropriately varying k within the range of $0 < k \leq 1$ thereby to apply the optimum feedback.

Furthermore, similar effectiveness in reducing or preventing limit cycle can be attained by the present invention with respect also to various digital filters represented by difference equations other than Eq. (1), and, moreover, the time for assumption of a constant state is short.

One example of a specific circuit in concrete form of the limit cycle reduction circuit 16 will now be described with reference to FIG. 3. The output of the above described D/A converter 14 is fed through a terminal 31 to the integrator 17, which in this example comprises operational amplifiers 32 and 33, resistors R1 through R5, and capacitors C1 and C2. The resulting integration output of the integrator 17 is supplied to the switching circuit 18 comprising an analog switch. On the other hand, the signal introduced through the aforementioned input terminal 11 is supplied to the input detector 19, which in this embodiment comprises operational amplifiers 35 through 38, resistors R6 through R12, capacitors C3 and C4, and a diode D1. In this input detector 19, the diode D1, the capacitor C3, and the resistor R7 constitute a rectifier, and the resistor R9 and the capacitor C4 constitute an integrator. The resistors R11 and R12 and the operational amplifier 38 constitute a comparator. The period in which there is no response to zero input is determined by the time constant of this integrator.

The output detection signal of the input detector 19 is applied to the switching circuit 18 and permits the output signal of the integrator 17 to pass. The signal which has passed through the switching circuit 18 is fed to the adder 20, which comprises an operational amplifier 39 and resistors R13 through R16, and is there added to a reference voltage from the reference voltage source 21 comprising power sources of positive and negative voltages $+15$ V and $-15$ V. The resulting output of the adder 20 is applied through an output terminal 40 to the A/D converter 12.

Figures 3, 6:
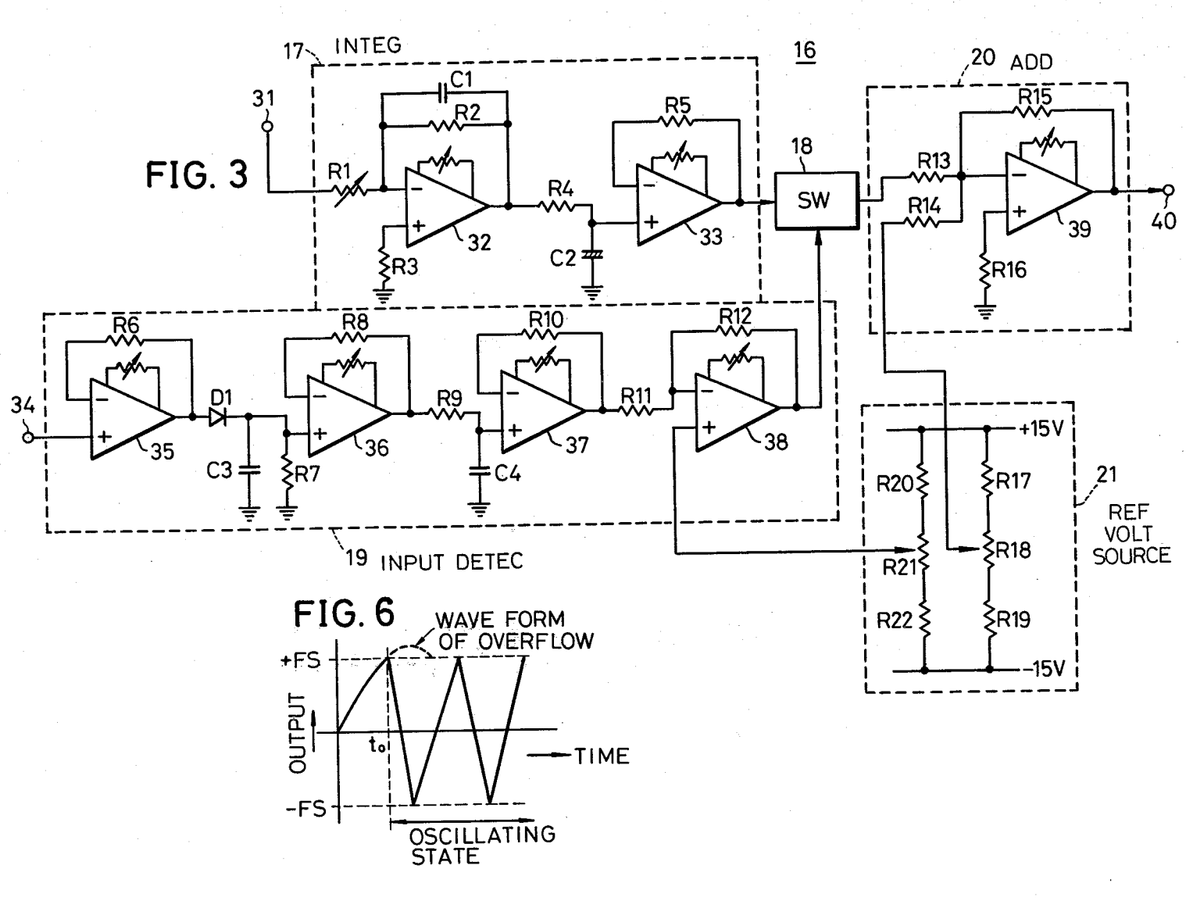
FIG. 3 is a circuit diagram of a specific circuit in concrete form for limit cycle reduction constituting an embodiment of the invention in the circuit arrangement shown in FIG. 1.
FIG. 6 is a graphical time chart indicating the waveform of an analog signal produced as output when an overflow occurs in a recursive digital filter.
Figure 4:
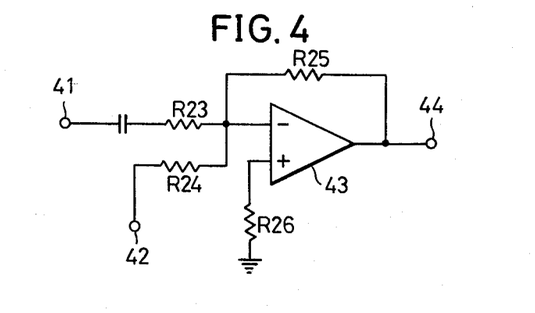
FIG. 4 is a circuit diagram of one part of an A/D converter in the circuit arrangement shown in FIG. 1.

Only one part of the A/D converter 12 to which the signal from the output terminal 40 is applied is shown in FIG. 4. The output signal of a sampling and holding circuit is applied to a terminal 41. The above mentioned signal from the output terminal 40 shown in FIG. 3 is applied to a terminal 42. The two signal thus applied through the terminals 41 and 42 are respectively passed through resistors R23 and R24 and supplied to the inversion input terminal of an operational amplifier 43. The resulting output signal led out through an output terminal 44 is supplied to an A/D converter of a later stage.

Constants of the circuit elements in the circuits illustrated in FIGS. 3 and 4 are set forth below.

| Resistors: | | | |
| --- | --- | --- | --- |
| R1 | 100 KΩ | R2 | 100 KΩ |
| R3 | 56 KΩ | R4 | 10 KΩ |
| R5 | 100 KΩ | R6 | 100 KΩ |
| R7 | 100 KΩ | R8 | 100 KΩ |
| R9 | 10 KΩ | R10 | 100 KΩ |
| R11 | 5.6 KΩ | R12 | 2.2 MΩ |
| R13 | 10 KΩ | R14 | 10 KΩ |
| R15 | 10 KΩ | R16 | 3.3 KΩ |
| R17 | 10 KΩ | R18 | 5.6 KΩ |
| R19 | 10 KΩ | R20 | 10 KΩ |
| R21 | 5.6 KΩ | R22 | 10 KΩ |
| R23 | 100 KΩ | R24 | 100 KΩ |
| R25 | 100 KΩ | R26 | 56 KΩ |
| Capacitors: | | | |
| C1 | 47000 PF | C2 | 0.47 μF |
| C3 | 1000 PF | C4 | 0.01 μF |

In the case where the digital filter in the above described embodiment of the invention is of the recursive type, an arrangement wherein the switching circuit 22 is caused to perform switching as described above by the output of the input detector 19, while the feedback circuit within the digital filter 13 is cut off, and the recursive term is not fed back may be used.

Figure 1:
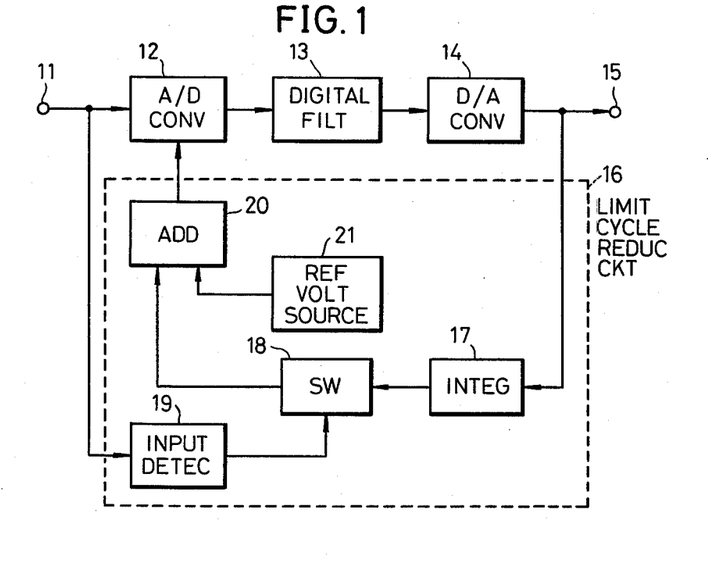
FIG. 1 is a block diagram showing the essential system of one embodiment of the circuit arrangement of a digital filter according to the present invention.
Figure 5:
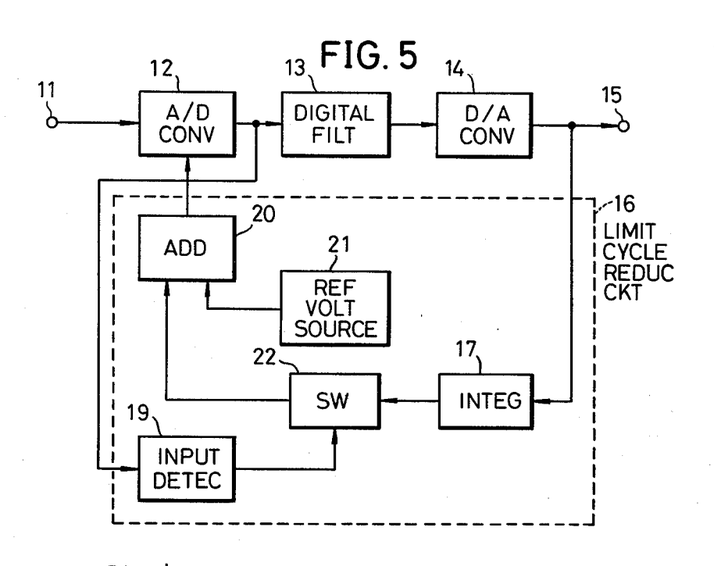
FIG. 5 is a block diagram showing an example of modification of the embodiment of the invention illustrated in FIG. 1.

A modification of the embodiment of the invention illustrated in FIG. 1 is shown in FIG. 5. In FIG. 5, those parts which are the same as corresponding parts in FIG. 1 are designated by like reference numerals. Description of such parts will be omitted. In the present modification of the invention, the input detector 19 is supplied with the output signal of the A/D converter 12 and carries out detection. The switching circuit 22 is so adapted that its switch changeover state is sustained for a specific time (for example, 5 msec.) after a switching signal due to input-zero detection from the input detector 19 is applied thereto. Because of this arrangement of the switching circuit 22, an output is produced therefrom in spite of the absence of an input signal in the A/D converter 12, and undesirable cutting off of the output of the integrator 17 by the switching circuit 22 does not arise.

Next, an example of an oscillation prevention circuit of the digital filter 13 constituting an embodiment of the invention will be described.

In general, among digital filters, there are those of the nonrecursive type wherein the output signal is determined without using a past output signal and those of the recursive type wherein the present output signal is determined by using a past output signal. Since a feedback path is provided in a recursive digital filter, there is a possibility of oscillation due to positive feedback.

As one example, a recursive type represented by a very simple difference equation as set forth below will now be considered.

$$y_n = a_0 x_n - b_1 y_{n-1} \quad (5)$$

where: $y_n$ is the output of the digital filter at the time nT; $y_{n-1}$ is the output of the digital filter at the time $(n-1)T$; T is the sampling period of the input digital signal; and $a_0$ and $b_1$ are respectively coefficients represented by finite number of bits, assuming values within $\pm 1$ in the case of complement representation of two. For this reason, suitable scaling becomes necessary.

When both sides of Eq. (5) are divided by 4, the following equation is obtained.

$$\tfrac{1}{4}y_n = \tfrac{1}{4}a_0 x_n - \tfrac{1}{4}b_1 y_{n-1} \quad (6)$$

Then by putting $\tfrac{1}{4}a_0 = A_0$ and $\tfrac{1}{4}b_1 = B_1$, the following equation is obtained.

$$\tfrac{1}{4}y_n = A_0 x_n - B_1 y_{n-1} \quad (7)$$

Accordingly, the output $y_{n+1}$ of the digital filter at the time $(n+1)T$ can be represented by the following equation.

$$\tfrac{1}{4}y_{n+1} = A_0 x_{n+1} - B_1 4 \cdot (\tfrac{1}{4}y_n) \quad (8)$$

The quantity $y_n$ in Eq. (8) is equal to four times the value of Eq. (7). Accordingly, the output obtained from Eq. (7) is actually multiplied by four and fed back to the input side of the digital filter. This multiplication of the output by four is accomplished by a bit shift in the digital filter. In other words, in the recursive digital filter, bit shift of the output is carried out. When the quantity $\tfrac{1}{4}y_n$ of Eq. (7) is bit represented, it becomes, for example, as indicated in the following Table I by complement representation of two.

TABLE I

| | $\tfrac{1}{4} y_n$ | | |
|---|---|---|---|
| Complement representation of 2 | 00010 | 00100 | 11110 |
| Analog value | 0.125 | 0.25 | −0.125 |

When bit shift is carried out for multiplying this by four, values as shown in the following Table II are obtained

TABLE II

| | $y_n$ | | |
|---|---|---|---|
| Complement representation of 2 (after bit shift) | 01000 | 10000 | 11000 |
| Analog value | 0.5 | −1.0 | −0.5 |

As is apparent from the above tables, when the quantity $\tfrac{1}{4}y_n$ is "00010" or "11110," $y_n$ can be accurately obtained by bit shift, but when it is "00100," $y_n$ becomes "10000" as a result of bit shift, and overflow occurs.

In general, a recursive digital filter is so designed that overflow as mentioned above will not occur, but an overflow can arise because of some cause. When this overflow occurs, the analog value becomes $-1$ when it should be $+1$, as mentioned above. As a consequence, heretofore, the feedback path of a recursive digital filter becomes a positive feedback, and the digital filter oscillates. Thus, there arises a serious problem in that an output oscillating with full scale $\pm FS$ as indicated in FIG. 6 is produced.

Accordingly, a digital filter has heretofore been so adapted that the output of the D/A converter in a later stage of the digital filter will be led out as an analog signal which has been limited and held in amplitude at a specific value or that the output will become zero. However, such circuit arrangements are complicated and expensive.

This problem has been overcome by the present embodiment of the invention, which will now be described in conjunction with FIGS. 7 through 10. The digital signal from the A/D converter 12 enters this oscillation prevention circuit shown in FIG. 7 through an input terminal 51 and is supplied to a register 52, where it is held. This digital signal which has been sampled with a sampling period T and subjected to digital processing. The resulting output signal of the register 52 is fed to a multiplier 53, where it is multiplied with a coefficient $a_0$ which has been read out from a read-only memory (ROM), as one example of a memory device. (Actually, however, this coefficient $a_0$ is read out with a finite bit as a digital quantity.) The resulting output signal of the multiplier 53 is fed to an adder 55, where it is digitally added to a digital signal from a register 56. The resulting signal, on one hand, is held in the register 56, while it is also applied respectively to a shift register 67 and a register 58.

Figure 7:
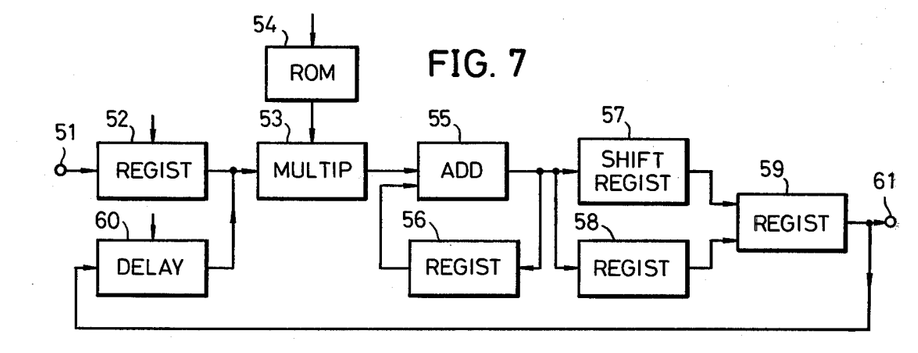
FIG. 7 is a block diagram of one embodiment of a oscillation prevention circuit of the digital filter according to the invention.

Of the output digital signals of the above mentioned adder 55, only the signal of the most significant bit (MSB, to which a polarity bit corresponds in the case where the coding is a complement representation of two) is supplied to the register 58, where it is held and stored. The signals of bits other than the most significant bit are applied to the shift register 57, where bit shifting is carried out. The bit shifted output of the shift register 57 and the held MSB output from the register 58 are supplied to a register 59, where they are rendered into a digital signal of normal complement representation of two and are thus held. When these operations are indicated as concrete examples in correspondence with the table set forth hereinabove in which $\tfrac{1}{4}y_n$ is represented, results as shown in table III are obtained.

TABLE III

| | $\tfrac{1}{4} y_n \rightarrow y_n$ | | |
|---|---|---|---|
| Complement representation of 2 (after bit shift) | (00010) ↓ ⓪ 1000 | (00100) ↓ ⓪ 0000 | (11110) ↓ ① 1000 |
| Analog value | 0.5 | 0.0 | −0.5 |

As is apparent from the above Table III, even in the case where bit shifting is carried out for multiplying "00100" by four, it becomes "00000," and the feedback path of the recursive digital filter does not become a positive feedback loop, whereby oscillation due to overflow does not arise as in prior arrangements. In the above table, the circular symbol ○ indicates a polarity bit which has been held by the register 58. Furthermore, the parentheses ( ) indicate the $\frac{1}{4}y_n$ prior to bit shifting.

The output digital signal of the above mentioned register 59 is supplied to the multiplier 53 after being delayed by a time equal to the aforementioned sampling period by a delay circuit 60. The digital signal thus delayed is multiplied in the multiplier 53 with a coefficient $b_1$ from the ROM 54. In this case, the register 52 and the delay circuit 60 are so gate controlled by timing pulses that an output signal will be led out alternately from either one. From the ROM 54, also, coefficients $a_0$ and $b_1$ are caused by timing pulses supplied from outside to be read out alternately depending on whether the output obtained is from the register 52 or whether it is from the delay circuit 54. Thereafter, by the same operation described hereinbefore, a digital signal $y_n$ as represented by Eq. (5) is supplied through an output terminal 61 to the D/A converter 14.

Figure 8:
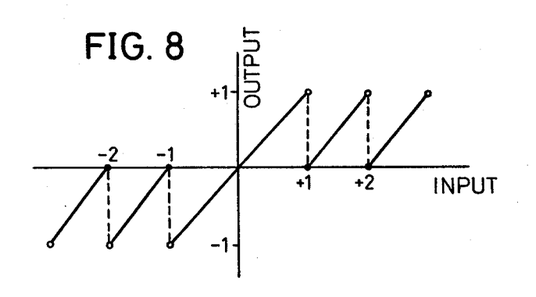
FIG. 8 is a graph indicating the input versus output characteristic of the circuit shown in FIG. 7.

The characteristic of input signal (analog value) versus output signal (analog value) of the present circuit according to the invention is indicated in FIG. 8. When the input is . . . $-2, -1, 0, 1, 2, \ldots$, the output becomes zero. At other times, the input and output are equal. For this reason, in the case where the input analog signal of the A/D converter has a sinusoidal waveform as indicated in FIG. 9, and, moreover, overflow arises in the broken-line portion, the analog signal led out from the output terminal 61 of the circuit shown in FIG. 7 and produced as output after undergoing digital-to-analog conversion in the D/A converter becomes as indicated by full line in FIG. 9.

In this case, according to the characteristic indicated in FIG. 8, the output analog signal becomes zero when the input analog signal is $\pm 1$. However, because of the transient response characteristic of the present circuit, the output analog signal becomes one which vibrates with a small amplitude as indicated by full line in the time intervals $t_1$ to $t_2$ and $t_3$ to $t_4$ in FIG. 9. On the other hand, in the case where the above mentioned input analog signal has a waveform which becomes saturated at a certain value 1.75 as indicated in FIG. 10, an analog signal of a waveform which converges to a certain value as indicated by full line is led out from the D/A converter in a later stage of the digital filter.

Figure 9:
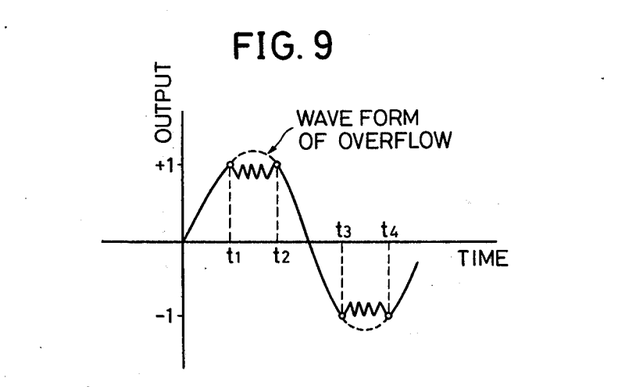
FIGS. 9 and 10 are graphical time charts respectively showing waveforms of analog signals produced as outputs when overflow occurs in the circuit illustrated in FIG. 7.
Figure 10:
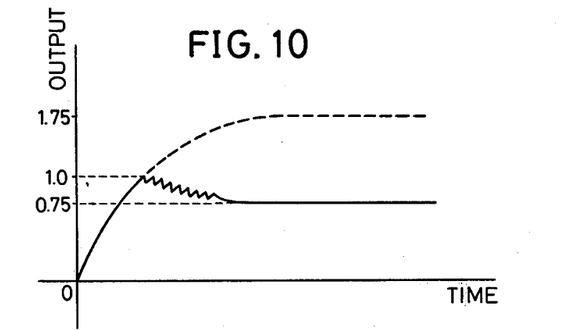

In FIGS. 8, 9, and 10, the value of $\pm 1$ of the input and output respectively represents the critical value (for example, $\pm 0.5$ volts) of the overflowing input analog signal and the value of the output analog signal at the time of full scale.

Thus, by the present embodiment of the invention, in a recursive digital filter, oscillation due to overflow is completely prevented and a simple and inexpensive countermeasure relative to oscillation is realized.

While the above described embodiment of the invention relates to a case of application to the simplest form recursive digital filter for the sake of convenience in description, the present invention is not limited thereto but is applicable also to other recursive digital filters representable by difference equations of plural degrees. Instead of the ROM 54, of course, a random access memory (RAM) or other memory device can be used.

Figure 11:
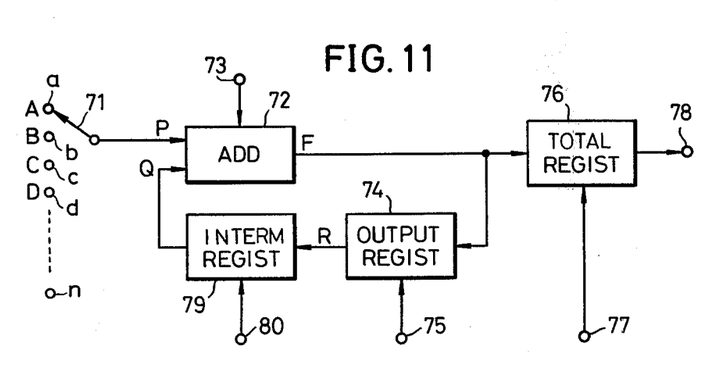
FIG. 11 is a block diagram showing an essential part of another embodiment of the oscillation prevention circuit of the digital filter of the invention.

Another embodiment of the oscillation prevention circuit according to the invention of the digital filter 13 will now be described. An essential feature of this embodiment of the invention is that an intermediate register is provided in the feedback path of the adder in the digital filter.

Figure 13:
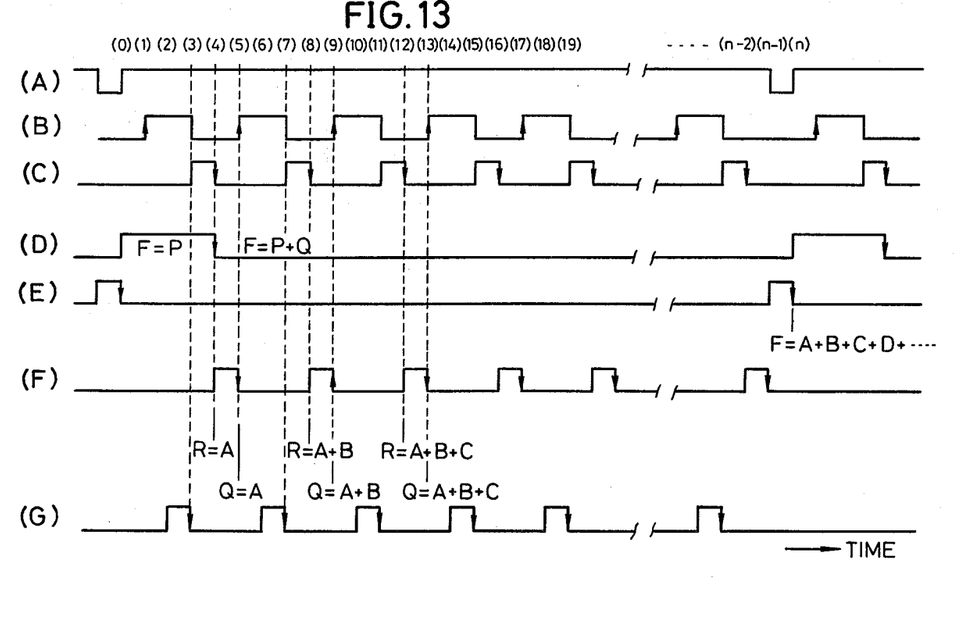
FIG. 13 shows interrelated graphical time charts respectively indicating signal waveforms for descriptions of operations of the block systems shown in FIGS. 11 and 12.

In the circuit shown in FIG. 11, an electronic switch 71 having terminals a through n is provided. This switch 71 cyclicly switched and connected successively to the terminals a through n by input switching pulses as indicated in FIG. 13(B) in synchronism with the rising parts of these pulses. A digital signal is being supplied to the terminals a through n. As a result of the switching of the electronic switch 71 in response to the pulses as indicated in FIG. 13(B), a signal A at the time (1), a signal B at the time (5), a signal C at the time (9), a signal D at the time (13), and so forth, are successively applied to an adder 72.

This adder 72 is adapted to digitally add the input digital signal P of the first input terminal and the input digital signal Q of the second input terminal when the control pulses from a terminal 73 are of low level, and, when the control pulses from the terminal 73 are of high level, to pass only the input digital signal P of the first input terminal. This adder 72 comprises a device such as, for example, an arithmetic logic unit (ALU). In this case, control pulses such as those indicated in FIG. 13(A) are applied to the terminal 73. For this reason, a digital signal A from the terminal a is initially led out after the access time of the adder 72 from the output terminal thereof. The output digital signal F of this adder 72 is applied to an output register 74, where it is stored at a time of fall of a control pulse as indicated in FIG. 13(C) from a terminal 75. On the other hand, the digital signal F is applied to a total register 76.

The output digital signal A of the adder 72 is received by and held in the output register 74 at the time (4). At the time (5), the output digital signal of the adder 72 is a digital signal $A+B$ which is the sum resulting from the digital addition of the signal A and the signal B from the terminal b and is introduced into and held in the output register 74 at the time (8).

Thereafter, the same operation is repeated, and, at the time (n), a control pulse as indicated in FIG. 13(E) from a terminal 77 falls, whereby the output digital signal F $(=A+B+C+D+\ldots)$ of the adder 72 is introduced into and held in the total register 76. The output digital signal of this total register 76 is a signal resulting from the digital addition of digital signals arriving at the terminals a through n and is led out as output through an output terminal 78. The adder 72, the output register 74, and the total register 76 are cleared by a clearing pulse as indicated at FIG. 13(A) upon completion of the addition operation.

In a digital adder of heretofore known arrangement wherein the output of the output register 74 is fed back, as it is, as Q to one input of the adder 72, the input and output of the output register 74 are directly connected and no longer separate in the periods of high level (for example, of time (3) to time (4) and of time (7) to time (8)) of the control pulses, as indicated in FIG. 13(C), of the output register 74 applied through the terminal 75. For this reason, oscillation occurs, or a value which is completely different from the original value is disadvantageously produced as output.

More specifically, in the period from the time (3) to the time (4), the adder control pulses as indicated in FIG. 13(D) from the terminal 73 are of high level, and only the input digital signal P of the first input terminal appears at the output end of the adder 72, whereby there is no problem. In the period from the time (7) to the time (8), however, the above mentioned adder control pulses are of low level, and the output digital signal F becomes a signal resulting from the digital addition of the input digital signals P and Q of the first and second input terminals. For this reason, in this high level period, the value of the output digital signal F becomes the value of the second input digital signal Q. While this should become A+B as a result of limitless feedback, there have been instances wherein it becomes mA+B, or oscillation occurs. The same applies also to the period from the time (11) to the time (12) and other periods of high level of the output register control pulses.

Accordingly, in the circuit of the present embodiment of the invention, the above described problem is overcome by the provision of an intermediate register 79 in the feedback path from the output register 74 to the adder 72. This intermediate register 79 is provided between the output register 74 and the adder 72 and operates to hold the output digital signal R of the output register 74 and to fix the value of the digital signal Q of the second input terminal of the adder 72 until the output register 74 receives and holds the value of the output digital signal F of the adder 72.

The operations from the time (3) to the time (9) can be described by means of equations as follows.

```
Time (3) F = P = A
     (4) R = A
     (5) Q = A
     (7) F = P + Q = B + A (Q = A, R = A, P = B)
     (8) R = A + B (Q = A, F = A + B)
     (9) Q = A + B (R = A + B, F = A + B + C)
       .  .
       .  .
```

That is, the intermediate register 79 operates to receive and hold the output digital signal R of the output register 74 at the instants (times (5), (9), (13), (17), . . . ) of fall of control pulses as indicated in FIG. 13(F) applied through a terminal 80 and to apply this signal R to the second input terminal of the adder 72. In this case, there is no overlapping of the high level periods of the control pulses (indicated in FIG. 13(C) of the output register 74 and the high level period of the control pulses (indicated in FIG. 13(F)) of the intermediate register 79. Therefore, there is no possibility of the feedback path of the adder 72 assuming a conductive state, and the feedback quantity can be fixed by causing the output register and the adder to be independent in a circuit. Accordingly, oscillation arising from limitless feedback of the output digital signal of this adder can be prevented. Furthermore, inaccurate digital addition can be prevented, and stable and accurate digital addition can be carried out.

Figure 12:
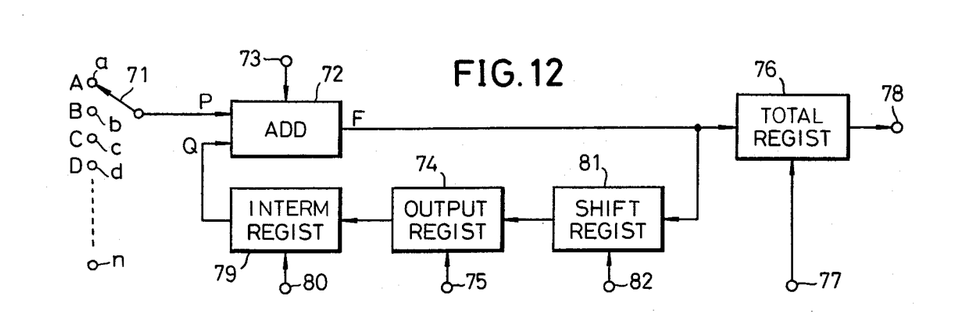
FIG. 12 is a block diagram showing an example of modification of the embodiment of the invention shown in FIG. 11.

An example of modification of the above described embodiment of the invention will now be described with reference to FIG. 12. In FIG. 12, those parts which are the same as corresponding parts in FIG. 11 are designated by like reference numerals and characters, and repeated description thereof will be omitted.

In this circuit, a shift register 81 is connected to the feedback path of the adder 72 between the adder 72 and the output register 74. This shift register 81 is operated by shift pulses introduced through a terminal 82 to shift the output digital signal F of the adder 72 by one bit each time. More specifically, this shift register 81 shifts the output digital signal F of the adder 72 by one bit at each of the instants of fall of the shift pulses as indicated in FIG. 13(G) which are applied through the terminal 82 to the shift register 81. As a result, a digital signal resulting from accurate weighted addition and represented by the expression $A + \frac{1}{2}B + (\frac{1}{2})^2 C + (\frac{1}{2})^3 D + \ldots$ is obtained at the output terminal 78. In this modified embodiment of the invention, also, oscillation can be prevented by means of an intermediate register 79.

Further, this invention is not limited to these embodiments but various variations and modifications may be made without departing from the scope of the invention.

What is claimed is:

1. A circuit for reducing limit cycle in a digital filter arrangement comprising:
   an A/D converter supplied with an input analog signal, for producing a pulse-modulated digital signal as output;
   a digital filter for digitally processing the digital signal supplied from said A/D converter with an operation of finite word length;
   a D/A converter supplied with the resulting output digital signal of said digital filter, for converting the resulting output digital signal thus supplied into an analog signal, to generate an output analog signal;
   an input detector supplied with the input analog signal, for detecting the non-existence of the input analog signal, to produce a detection signal;
   a first integrator for integrating the output signal supplied from said D/A converter;
   a switching circuit responsive to the output detection signal supplied from said input detector, for passing the resulting output signal of said first integrator;
   a reference voltage source for producing a reference voltage; and
   a first adder for adding the signal thus passed by said switching circuit and said reference voltage supplied from said reference voltage source, to feed back the added signal thus obtained to said A/D converter.

2. A circuit for reducing limit cycle in a digital filter arrangement as claimed in claim 1 in which said input detector produces said detection signal only when the input analog signal does not exist continuously for a period equal to or longer than a specific period.

3. A circuit for reducing limit cycle in a digital filter arrangement as claimed in claim 1 in which said switching circuit comprises an analog switch.

4. A circuit for reducing limit cycle in a digital filter arrangement as claimed in claim 1 in which said input detector comprises a rectifier for rectifying an input signal, a second integrator for integrating the rectified output of said rectifier, and a comparator for comparing the output of said second integrator with said reference voltage supplied from said reference voltage source, to produce said detection signal.

5. A circuit for reducing limit cycle in a digital filter arrangement as claimed in claim 1 in which said input detector is supplied with the output signal of said A/D converter.

6. A circuit for reducing limit cycle in a digital filter as claimed in claim 1 in which said digital filter comprises a memory device for producing a coefficient which is to be multiplied, a multiplier for multiplying the coefficient supplied from said memory device with an input digital signal supplied to said multiplier, a second adder supplied with an output digital signal of said multiplier, a feed-back path for feeding back an output of said second adder by way of a first input register to an input of said second adder, a second register for holding and storing the most significant bit of the output digital signal of said second adder, a shift register for shifting other bits except the most significant bit in the output digital signal of said second adder, a third register supplied with an output signal of said second register and a bit shifted output digital signal of said shift register for holding them to responsively produce a digital signal wherein the output signal of said second register assumes the most significant bit, and a delay device for delaying the output digital signal of said third register by a predetermined period, said input digital signal supplied to said multiplier being supplied from said third register.

7. A circuit for reducing limit cycle in a digital filter as claimed in claim 1 in which said digital filter comprises a second adder supplied with an input digital signal, an output register provided in a feed-back path for feeding back an output of said second adder, and an intermediate register provided in said feed-back path connected in a series manner with said output register, said output register and said intermediate register being operated so that a period in which said output register receives a digital signal does not coincide with a period in which said intermediate register receives a digital signal, said second adder successively adding the output digital signal of said intermediate register and said input digital signal successively in a digital manner.

8. A circuit for reducing limit cycle in a digital filter as claimed in claim 7 in which said digital filter further comprises a shift register provided in said feed-back path which is connected to an input side of said output register, said shift register being capable of performing bit shifting.

* * * * *